US009472439B2

(12) United States Patent
Takamoto et al.

(10) Patent No.: US 9,472,439 B2
(45) Date of Patent: Oct. 18, 2016

(54) REINFORCING SHEET AND METHOD FOR PRODUCING SECONDARY MOUNTED SEMICONDUCTOR DEVICE

(71) Applicant: NITTO DENKO CORPORATION, Ibaraki-shi, Osaka (JP)

(72) Inventors: Naohide Takamoto, Ibaraki (JP); Kosuke Morita, Ibaraki (JP); Hiroyuki Senzai, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/775,445

(22) PCT Filed: Mar. 12, 2014

(86) PCT No.: PCT/JP2014/056441
§ 371 (c)(1),
(2) Date: Sep. 11, 2015

(87) PCT Pub. No.: WO2014/142154
PCT Pub. Date: Sep. 18, 2014

(65) Prior Publication Data
US 2016/0042986 A1    Feb. 11, 2016

(30) Foreign Application Priority Data
Mar. 13, 2013   (JP) .................. 2013-050794

(51) Int. Cl.
*H01L 21/683* (2006.01)
*B32B 27/08* (2006.01)
(Continued)

(52) U.S. Cl.
CPC ............ *H01L 21/6836* (2013.01); *B32B 5/02* (2013.01); *B32B 5/26* (2013.01); *B32B 7/12* (2013.01);
(Continued)

(58) Field of Classification Search
None
See application file for complete search history.

(56) References Cited

U.S. PATENT DOCUMENTS

| 2005/0008873 | A1 | 1/2005 | Noro et al. |
| 2009/0075429 | A1 | 3/2009 | Sato et al. |

(Continued)

FOREIGN PATENT DOCUMENTS

| JP | 200528734 A | 2/2005 |
| JP | 4699189 B2 | 6/2011 |

(Continued)

OTHER PUBLICATIONS

ISA Japanese Patent Office, International Search Report Issued in Application No. PCT/JP2014/056441, May 20, 2014, WIPO, 4 pages.

(Continued)

*Primary Examiner* — Asok K Sarkar
(74) *Attorney, Agent, or Firm* — Alleman Hall McCoy Russell & Tuttle LLP

(57) ABSTRACT

Provided are a reinforcing sheet which is capable of forming a secondary mounted semiconductor device excellent in impact resistance and which is capable of enhancing efficiency of a secondary mounting process; and a method for producing a secondary mounted semiconductor device using the reinforcing sheet. The present invention provides a reinforcing sheet for reinforcing a secondary mounted semiconductor device in which a primary mounted semiconductor device with a bump electrode formed on a first main surface is electrically connected to a wiring substrate through the bump electrode, wherein the reinforcing sheet includes a base material layer, a pressure-sensitive adhesive layer, and a thermosetting resin layer in this order, and the pressure-sensitive adhesive layer has a breaking strength of 0.07 MPa or more, and a melt viscosity of 4000 Pa·s or less at 60 to 100° C.

7 Claims, 3 Drawing Sheets

(51) Int. Cl.

| | | |
|---|---|---|
| H01L 21/56 | (2006.01) | |
| H01L 23/00 | (2006.01) | |
| B32B 7/12 | (2006.01) | |
| B32B 5/02 | (2006.01) | |
| B32B 5/26 | (2006.01) | |
| B32B 15/08 | (2006.01) | |
| B32B 25/06 | (2006.01) | |
| B32B 25/08 | (2006.01) | |
| B32B 25/10 | (2006.01) | |
| B32B 25/12 | (2006.01) | |
| B32B 25/14 | (2006.01) | |
| B32B 27/10 | (2006.01) | |
| B32B 27/12 | (2006.01) | |
| B32B 27/20 | (2006.01) | |
| B32B 27/22 | (2006.01) | |
| B32B 27/28 | (2006.01) | |
| B32B 27/30 | (2006.01) | |
| B32B 27/32 | (2006.01) | |
| B32B 27/34 | (2006.01) | |
| B32B 27/36 | (2006.01) | |
| B32B 27/38 | (2006.01) | |
| B32B 27/40 | (2006.01) | |
| B32B 27/42 | (2006.01) | |
| B32B 29/00 | (2006.01) | |
| H01L 23/31 | (2006.01) | |

(52) U.S. Cl.
CPC ............ *B32B 15/08* (2013.01); *B32B 25/06* (2013.01); *B32B 25/08* (2013.01); *B32B 25/10* (2013.01); *B32B 25/12* (2013.01); *B32B 25/14* (2013.01); *B32B 27/08* (2013.01); *B32B 27/10* (2013.01); *B32B 27/12* (2013.01); *B32B 27/20* (2013.01); *B32B 27/22* (2013.01); *B32B 27/281* (2013.01); *B32B 27/283* (2013.01); *B32B 27/285* (2013.01); *B32B 27/288* (2013.01); *B32B 27/304* (2013.01); *B32B 27/308* (2013.01); *B32B 27/32* (2013.01); *B32B 27/34* (2013.01); *B32B 27/36* (2013.01); *B32B 27/365* (2013.01); *B32B 27/38* (2013.01); *B32B 27/40* (2013.01); *B32B 27/42* (2013.01); *B32B 29/005* (2013.01); *H01L 21/561* (2013.01); *H01L 21/568* (2013.01); *H01L 24/81* (2013.01); *H01L 24/97* (2013.01); *B32B 2255/02* (2013.01); *B32B 2255/10* (2013.01); *B32B 2255/12* (2013.01); *B32B 2255/20* (2013.01); *B32B 2255/205* (2013.01); *B32B 2262/0269* (2013.01); *B32B 2262/101* (2013.01); *B32B 2307/50* (2013.01); *B32B 2307/514* (2013.01); *B32B 2307/558* (2013.01); *B32B 2457/00* (2013.01); *B32B 2457/14* (2013.01); *H01L 23/3128* (2013.01); *H01L 24/13* (2013.01); *H01L 24/16* (2013.01); *H01L 24/45* (2013.01); *H01L 24/48* (2013.01); *H01L 2221/6834* (2013.01); *H01L 2221/68318* (2013.01); *H01L 2221/68327* (2013.01); *H01L 2221/68336* (2013.01); *H01L 2221/68377* (2013.01); *H01L 2221/68381* (2013.01); *H01L 2221/68386* (2013.01); *H01L 2224/13101* (2013.01); *H01L 2224/16225* (2013.01); *H01L 2224/45144* (2013.01); *H01L 2224/45147* (2013.01); *H01L 2224/48227* (2013.01); *H01L 2224/81191* (2013.01); *H01L 2924/15787* (2013.01)

(56) References Cited

U.S. PATENT DOCUMENTS

| | | | |
|---|---|---|---|
| 2011/0217501 A1* | 9/2011 | Shishido | ............... H01L 24/27 428/41.8 |
| 2012/0208009 A1 | 8/2012 | Oda et al. | |
| 2013/0202851 A1* | 8/2013 | Johnson | ................... B32B 7/06 428/143 |
| 2013/0288428 A1* | 10/2013 | Oda | ....................... H01L 24/19 438/107 |

FOREIGN PATENT DOCUMENTS

| | | |
|---|---|---|
| JP | 2011171712 A | 9/2011 |
| JP | 2012169482 A | 9/2012 |
| WO | 2006118033 A1 | 11/2006 |
| WO | 2012026431 A1 | 3/2012 |

OTHER PUBLICATIONS

International Bureau of WIPO, International Preliminary Report on Patentability Issued in Application No. PCT/JP2014/056441, Sep. 24, 2015, 7 pages.

* cited by examiner

REINFORCING SHEET AND METHOD FOR PRODUCING SECONDARY MOUNTED SEMICONDUCTOR DEVICE

TECHNICAL FIELD

The present invention relates to a reinforcing sheet and a method for producing a secondary mounted semiconductor device.

BACKGROUND ART

The demand for high density mounting associated with the compacting and thinning of electronic devices has been rapidly increasing, particularly for applications in portable electronic devices such as mobile phones. Accordingly, for semiconductor packages, the surface mounting type suitable for high density mounting has become mainstream in place of the conventional pin insertion type. In the surface mounting type, a semiconductor device with a semiconductor element resin-sealed thereto is directly soldered to a printed board, etc., for secondary mounting with a connecting terminal such as a solder ball interposed therebetween.

Here, for applications in portable electronic devices, impact resistance is required because impacts from falling are often applied. On the other hand, in secondary mounting as described above, a space between a primary mounted semiconductor device and a wiring substrate is filled with a sealing resin in order to secure connection reliability between the primary mounted semiconductor device and the substrate. As the sealing resin, liquid sealing resins are widely used, but it is difficult to adjust the injection position and the injection amount of the sealing resin because the sealing resin is liquid, or in the case of a relatively large solder ball for secondary mounting, the gap between the solder ball and the substrate becomes wide to increase the injection amount. Accordingly, a technique has been proposed in which using a thermosetting resin sheet, a region in the vicinity of the connection part between a solder ball and a secondary mounted substrate, rather than the whole space between a semiconductor device and a substrate, is intensively reinforced (Patent Document 1).

PRIOR ART DOCUMENT

Patent Document

Patent Document 1: Japanese Patent No. 4699189

DISCLOSURE OF THE INVENTION

Problems to be Solved by the Invention

However, it has been found that impacts from falling, etc., applied to a portable electronic device may cause cracks not at a solder connection part but at a base part of a solder ball on the primary mounted substrate side, leading to the occurrence of a functional disorder, such as a connection failure, and measures against such an event are required. In the above-mentioned technique, it is necessary to employ additional members or steps for processing, such as backside grinding and dicing, of a laminate of one or more semiconductor devices and thermosetting resin sheets, and there is room for improvement for enhancement of efficiency of the whole process for production of a secondary mounted semiconductor device.

An object of the present invention is to provide a reinforcing sheet which is capable of forming a secondary mounted semiconductor device excellent in impact resistance and which is capable of enhancing efficiency of a secondary mounting process; and a method for producing a secondary mounted semiconductor device using the reinforcing sheet.

Means for Solving the Problems

Accordingly, the present inventors have prepared a bump electrode reinforcing sheet by combining a conventional processing tape such as a backside grinding tape for grinding the backside or a dicing tape for dicing and a predetermined thermosetting resin sheet, and made an attempt to reinforce a base part of the bump electrode on the primary mounted substrate side (hereinafter, also referred to simply as a "base part") and enhance efficiency of the production process including various kinds of processing. However, it was found that when such a sheet was used, exposure of the tip of the bump electrode became insufficient, causing a connection failure, and staining of the bump electrode occurred after the processing tape was peeled off.

The present inventors have extensively conducted studies, and resultantly found that by employing the configuration described below, the above-mentioned object can be achieved, leading to completion of the present invention.

The present invention provides a reinforcing sheet for reinforcing a secondary mounted semiconductor device in which a primary mounted semiconductor device with a bump electrode formed on a first main surface is electrically connected to a wiring substrate through the bump electrode, wherein the reinforcing sheet includes a base material layer, a pressure-sensitive adhesive layer, and a thermosetting resin layer in this order, and the pressure-sensitive adhesive layer has a breaking strength of 0.07 MPa or more, and a melt viscosity of 4000 Pa·s or less at 60 to 100° C.

Since the reinforcing sheet includes a processing tape including a base material layer and a pressure-sensitive adhesive layer, and a thermosetting resin layer capable of reinforcing a base part of a bump electrode, the base part of the bump electrode can be reinforced, and processing such as backside grinding and dicing can be continuously performed, so that a secondary mounted semiconductor device excellent in impact resistance can be prepared, and efficiency of the process for production thereof can be easily enhanced. Since the breaking strength of the pressure-sensitive adhesive layer is 0.07 MPa or more, breaking of the pressure-sensitive adhesive layer can be suppressed at the time of peeling off the primary mounted semiconductor device from the processing tape, so that an adhesive residue on the bump electrode can be prevented. Since the melt viscosity of the pressure-sensitive adhesive layer at 60 to 100° C. is 4000 Pa·s or less, the bump electrode can easily enter into the pressure-sensitive adhesive layer at the time of bonding the reinforcing sheet and the primary mounted semiconductor device under heating, so that fine adjustment of the arrangement position of the thermosetting resin layer while viewing the bump electrode from the side can be easily performed. As a result, the entry amount of the bump electrode can be adjusted even when the shape and the size of the bump electrode are changed, and therefore the base part can be reinforced in a variety of bump electrodes. Methods for measurement of breaking strength and melt viscosity are as described in the examples.

In the reinforcing sheet, a thickness of the thermosetting resin layer is preferably 50% or less of the height of the bump electrode. Accordingly, the bump electrode can extend over the thermosetting resin layer to the pressure-sensitive adhesive layer. As a result, the bump electrode is exposed from the thermosetting resin layer at the time of subsequently peeling off the processing tape, and therefore a proper electrical connection with the wiring substrate can be obtained. At the same time, the amount of exposure of the bump electrode from the thermosetting resin layer is easily adjusted, and therefore the degree of reinforcement of the base part can be easily and conveniently adjusted.

In the reinforcing sheet, a peel strength between the thermosetting resin layer and the pressure-sensitive adhesive layer is preferably not less than 0.02 N/20 mm and not more than 0.3 N/20 mm. When the peel strength is in the above-mentioned range, both the retention strength of the primary mounted semiconductor device at the time of processing and the peeling property at the time of peeling off the primary mounted semiconductor device from the processing tape can be secured with good balance.

Preferably, the reinforcing sheet further includes an intermediate layer formed of a thermoplastic resin between the base material layer and the pressure-sensitive adhesive layer. When the size of the bump electrode increases, it is necessary to increase the thickness of each of the thermosetting resin layer and the pressure-sensitive adhesive layer for entry of the bump electrode at the time of bonding the reinforcing sheet. However, when the thickness of each of the layers is increased, it is difficult to intensively reinforce the base region of the bump electrode, or the breaking strength of the pressure-sensitive adhesive layer decreases. On the other hand, when an intermediate layer formed of a thermoplastic resin is provided, entry of the bump electrode into the intermediate layer softened by heating at the time of bonding is facilitated, and therefore the necessity to change the thickness of each of the thermosetting resin layer and the pressure-sensitive adhesive layer can be reduced.

The present invention also includes a method for producing a secondary mounted semiconductor device in which a primary mounted semiconductor device with a bump electrode formed on a first main surface is electrically connected to a wiring substrate through the bump electrode, the method including the steps of:

(A) bonding the reinforcing sheet to the first main surface of the primary mounted semiconductor device;

(B) subjecting the primary mounted semiconductor device to processing under retention by the reinforcing sheet;

(C) peeling off the thermosetting resin layer and the pressure-sensitive adhesive layer in the reinforcing sheet to obtain a primary mounted semiconductor device with the thermosetting resin layer; and (D) electrically connecting the primary mounted semiconductor device with the thermosetting resin layer to the wiring substrate through the bump electrode.

According to the production method, the primary mounted semiconductor device can be subjected to various kinds of processing under retention by the reinforcing sheet while the thermosetting resin layer for reinforcing the base part of the bump electrode is provided on the primary mounted semiconductor device, and thus a secondary mounted semiconductor device excellent in impact resistance can be efficiently produced.

Preferably, the reinforcing sheet is bonded in such a manner that the bump electrode extends to the pressure-sensitive adhesive layer in the step (A) of the production method. Accordingly, an electrical connection between the bump electrode and the wiring substrate can be secured, so that connection reliability can be improved.

In the production method, a radiation-curable pressure-sensitive adhesive layer may be provided as the pressure-sensitive adhesive layer, and irradiated with radiation, followed by carrying out the step (B). By only irradiating the radiation-irradiated type pressure-sensitive adhesive layer with radiation, the peel strength between the thermosetting resin layer and the pressure-sensitive adhesive layer can be reduced so that the thermosetting resin layer can be easily peeled off.

MODE FOR CARRYING OUT THE INVENTION

The present invention provides a reinforcing sheet for reinforcing a secondary mounted semiconductor device in which a primary mounted semiconductor device with a bump electrode formed on a first main surface is electrically connected to a wiring substrate through the bump electrode, wherein the reinforcing sheet includes a base material layer, a pressure-sensitive adhesive layer, and a thermosetting resin layer in this order, and the pressure-sensitive adhesive layer has a breaking strength of 0.07 MPa or more, and a melt viscosity of 4000 Pa·s or less at 60 to 100° C.

The present invention provides a method for producing a secondary mounted semiconductor device in which a primary mounted semiconductor device with a bump electrode formed on a first main surface is electrically connected to a wiring substrate through the bump electrode, the method including the steps of: (A) bonding the reinforcing sheet to the first main surface of the primary mounted semiconductor device; (B) subjecting the primary mounted semiconductor device to processing under retention by the reinforcing sheet; (C) peeling off the thermosetting resin layer and the pressure-sensitive adhesive layer in the reinforcing sheet to obtain a primary mounted semiconductor device with the thermosetting resin layer; and (D) electrically connecting the primary mounted semiconductor device with the thermosetting resin layer to the wiring substrate through the bump electrode. Hereinafter, the first embodiment as one embodiment of the present invention will be described based on the method for producing a secondary mounted semiconductor device.

First Embodiment

In the first embodiment, an aspect will be described in which backside grinding is performed as processing of a primary mounted semiconductor device using a package with a semiconductor chip flip-chip-mounted on an interposer as the primary mounted semiconductor device.

[Step (A)]

In the step (A), a predetermined reinforcing sheet is bonded to a first main surface of the primary mounted semiconductor device. Hereinafter, the reinforcing sheet will be first described, followed by describing a process for production of a secondary mounted semiconductor device using the reinforcing sheet.

(Reinforcing Sheet)

Figure 1:
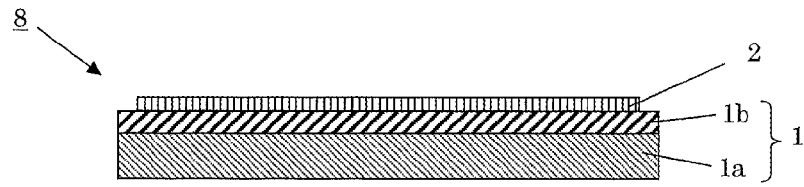
FIG. 1 is a sectional schematic view showing a reinforcing sheet according to one embodiment of the present invention.

As shown in FIG. 1, a reinforcing sheet 8 includes a base material layer 1a, a pressure-sensitive adhesive layer 1b, and a thermosetting resin layer 2 in this order. In this embodiment, the base material layer 1a and the pressure-sensitive adhesive layer 1b form a backside grinding tape 1. As shown in FIG. 1, the thermosetting resin layer 2 should be provided in a size sufficient for bonding a primary mounted semiconductor device 10 (see FIG. 2A) to a resin sealing assembly, and may be laminated on the entire surface of the backside grinding tape 1.

(Backside Grinding Tape)

The backside grinding tape 1 includes the base material layer 1a, and the pressure-sensitive adhesive layer 1b laminated on the base material layer 1a. The thermosetting resin layer 2 is laminated on the pressure-sensitive adhesive layer 1b.

(Base Material Layer)

The base material layer 1a serves as a strength matrix for the reinforcing sheet 8. Examples include polyolefins such as low-density polyethylene, linear polyethylene, medium-density polyethylene, high-density polyethylene, ultra-low-density polyethylene, random copolymerization polypropylene, block copolymerization polypropylene, homopolypropylene, polybutene and polymethylpentene, ethylene-vinyl acetate copolymers, ionomer resins, ethylene-(meth)acrylic acid copolymers, ethylene-(meth)acrylic acid ester (random and alternating) copolymers, ethylene-butene copolymers, ethylene-hexene copolymers, polyurethane, polyesters such as polyethylene terephthalate and polyethylene naphthalate, polycarbonate, polyimide, polyether ether ketone, polyimide, polyether imide, polyamide, total aromatic polyamide, polyphenyl sulfide, aramid (paper), glass, glass cloth, fluororesins, polyvinyl chloride, polyvinylidene chloride, cellulose-based resins, silicone resins, metals (foils), and paper. When the pressure-sensitive adhesive layer 1b is ultraviolet ray-curable, the base material layer 1a is preferably permeable to ultraviolet rays.

In addition, examples of the material of the base material layer 1a include polymers such as cross-linked products of the resins described above. For the plastic film described above, an unstretched film may be used, or a film subjected to uniaxial or biaxial stretching may be used as necessary.

The surface of the base material layer 1a can be subjected to a common surface treatment, for example, a chemical or physical treatment such as a chromic acid treatment, ozone exposure, flame exposure, high-voltage electrical shock exposure, or an ionized radiation treatment, or a coating treatment with a primer (e.g. adhesive substance to be described) for improving adhesion with an adjacent layer, the retention property, and so on.

For the base material layer 1a, the same material or different materials can be appropriately selected and used, and one obtained by blending several materials can be used as necessary. The base material layer 1a can be provided thereon with a vapor-deposited layer of an electrically conductive substance made of a metal, an alloy, an oxide thereof, or the like and having a thickness of about 30 to 500 Å for imparting an antistatic property. An antistatic agent may be added into the base material layer to impart the antistatic property. The base material layer 1a may be a single layer or a multiple layer having two or more layers.

The thickness of the base material layer 1a is not particularly limited, and can be appropriately determined, but is generally about 5 to 200 μm, and is preferably 35 to 120 μm.

The base material layer 1a may contain various kinds of additives (e.g. colorant, filler, plasticizer, antiaging agent, antioxidant, surfactant, flame retardant, etc.) within the bounds of not impairing the effect of the present invention.

(Pressure-Sensitive Adhesive Layer)

The breaking strength of the pressure-sensitive adhesive layer 1b should be 0.07 MPa or more, and is preferably 0.08 Mpa or more, more preferably 0.1 Mpa or more. Since the breaking strength of the pressure-sensitive adhesive layer 1b is 0.07 MPa or more, breaking of the pressure-sensitive adhesive layer can be suppressed at the time of peeling off the primary mounted semiconductor device from the backside grinding tape, so that an adhesive residue on the bump electrode or the thermosetting resin layer can be prevented. The upper limit value of the breaking strength is not particularly limited, but the breaking strength is preferably 2.0 MPa or less, more preferably 1.0 MPa or less from the viewpoint of followability to irregularities of the bump. When the pressure-sensitive adhesive layer 1b is a radiation-curable pressure-sensitive adhesive layer (as described later), the breaking strength after curing should satisfy the above-mentioned range.

The melt viscosity of the pressure-sensitive adhesive layer 1b at 60 to 100° C. should be 4000 Pa·s or less, and is preferably 3500 Pa·s or less, more preferably 3000 Pa·s or more. Accordingly, the bump electrode can easily enter into the pressure-sensitive adhesive layer at the time of bonding the reinforcing sheet 8 and the primary mounted semiconductor device 10 under heating, so that fine adjustment of the arrangement position of the thermosetting resin layer while viewing the bump electrode from the side can be easily performed. As a result, the entry amount of the bump electrode can be adjusted even when the shape and the size of the bump electrode are changed, and therefore the base part can be reinforced in a variety of bump electrodes. The lower limit value of the melt viscosity is not particularly limited, but the melt viscosity is preferably 100 Pa·s or more, more preferably 500 Pa·s or more for preventing protrusion of the pressure-sensitive adhesive layer and an adhesive residue on the bump electrode at the time of bonding.

A pressure-sensitive adhesive to be used for formation of the pressure-sensitive adhesive layer 1b is not particularly limited as long as the primary mounted semiconductor device can be firmly retained with the interposition of the thermosetting resin layer in backside grinding, and the primary mounted semiconductor device with the thermosetting resin layer can be controlled to be peelable in transference of the primary mounted semiconductor device with the thermosetting resin layer to the dicing tape after backside grinding. For example, a common pressure-sensitive adhesive such as an acryl-based pressure-sensitive adhesive or a rubber-based pressure-sensitive adhesive can be used. As the pressure-sensitive adhesive, an acryl-based pressure-sensitive adhesive with an acryl-based polymer as abase polymer is preferred from the viewpoint of ease of cleaning an electronic component such as a semiconductor wafer or glass, which must be free from staining, using an organic solvent such as ultrapure water or an alcohol.

Examples of the acryl-based polymer include those using an acrylate as a main monomer component. Examples of the acrylate include one or more of (meth)acrylic acid alkyl esters (for example, linear or branched alkyl esters with the alkyl group having 1 to 30, particularly 4 to 18 carbon atoms, such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nony ester, decyl ester, isodecyl ester, undecyl ester, dodecyl ester, tridecyl ester, tetradecyl ester, hexadecyl ester, octadecyl ester and eicosyl ester) and (meth)acrylic acid cycloalkyl esters (for example, cyclopentyl ester and cyclohexyl ester, etc.). The (meth)acrylic acid ester refers to an acrylic acid ester and/or a methacrylic acid ester, and (meth) has the same meaning throughout the present invention.

The acryl-based polymer may contain a unit corresponding to any other monomer component capable of being copolymerized with the (meth)acrylic acid alkyl ester or cycloalkyl ester as necessary for the purpose of modifying cohesive strength, heat resistance, and so on. Examples of the monomer component include carboxyl group-containing monomers such as acrylic acid, methacrylic acid, carboxyethyl(meth)acrylate, carboxypentyl(meth)acrylate, itaconic acid, maleic acid, fumaric acid and crotonic acid; acid anhydride monomers such as maleic anhydride and itaconic anhydride; hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate and (4-hydroxymethylcyclohexyl)-methyl(meth)acrylate; sulfonic acid group-containing monomers such as styrenesulfonic acid, allylsulfonic acid, 2-(meth)acrylamide-2-methylpropanesulfonic acid, (meth)acrylamidepropanesulfonic acid, sulfopropyl(meth)acrylate and (meth)acryloyloxynaphthalenesulfonic acid; phosphoric acid group-containing monomers such as 2-hydroxyethylacryloyl phosphate; and acrylamide and acrylonitrile. One or more of these monomers capable of being copolymerized can be used. The used amount of the monomer component capable of copolymerization is preferably 40% by weight or less based on total monomer components.

Further, the acryl-based polymer may contain a polyfunctional monomer or the like as a monomer component for copolymerization as necessary for the purpose of cross-linking. Examples of the polyfunctional monomer include hexanediol di(meth)acrylate, (poly)ethylene glycol di(meth)acrylate, (poly)propylene glycol di(meth)acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth)acrylate, epoxy(meth)acrylate, polyester(meth)acrylate, and urethane (meth)acrylate. One or more of these polyfunctional monomers can be used. The used amount of the polyfunctional monomer is preferably 30% by weight or less based on total monomer components from the viewpoint of an adhesion property.

The acryl-based polymer is obtained by subjecting a single monomer or monomer mixture of two or more kinds of monomers to polymerization. Polymerization can be carried out by any method such as solution polymerization, emulsion polymerization, bulk polymerization, or suspension polymerization. The content of low-molecular weight substances is preferably low from the viewpoint of prevention of contamination of a clean adherend. In this respect, the number average molecular weight of the acryl-based polymer is preferably 300000 or more, further preferably about 400000 to 3000000.

For the pressure-sensitive adhesive, an external cross-linker can also be appropriately employed for increasing the number average molecular weight of an acryl-based polymer or the like as a base polymer. Specific examples of the external cross-linking methods include a method in which a so-called cross-linker such as a polyisocyanate compound, an epoxy compound, an aziridine compound, or a melamine-based cross-linker is added and reacted. When an external cross-linker is used, the used amount thereof is appropriately determined according to a balance with a base polymer to be cross-linked, and further a use application as a pressure-sensitive adhesive. Generally, the external cross-linker is blended in an amount of preferably about 5 parts by weight or less, further preferably 0.1 to 5 parts by weight, based on 100 parts by weight of the base polymer. Further, for the pressure-sensitive adhesive, previously known various kinds of additives, such as a tackifier and an anti-aging agent, may be used as necessary in addition to the aforementioned components.

The pressure-sensitive adhesive layer 1b can be formed by radiation curing-type pressure-sensitive adhesive. By irradiating the radiation curing-type pressure-sensitive adhesive with radiations such as ultraviolet rays, the degree of cross-linking thereof can be increased to easily reduce its adhesive power, so that peeling off of the primary mounted semiconductor device with the thermosetting resin layer can be easily performed. Examples of radiations include X-rays, ultraviolet rays, electron rays, $\alpha$ rays, $\beta$ rays, and neutron rays.

For the radiation curing-type pressure-sensitive adhesive, one having a radiation-curable functional group such as a carbon-carbon double bond and showing adherability can be used without particular limitation. Examples of the radiation curing-type pressure-sensitive adhesive may include, for example, an addition-type radiation-curable pressure-sensitive adhesive obtained by blending a radiation-curable monomer component or an oligomer component with a general pressure-sensitive adhesive such as the above-mentioned acryl-based pressure-sensitive adhesive or a rubber-based pressure-sensitive adhesive.

Examples of the radiation curable monomer component to be blended include urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butanediol di(meth)acrylate.

Examples of the radiation curable oligomer component include various oligomers such as urethane-based, polyether-based, polyester-based, polycarbonate-based and polybutadiene-based oligomers, and the appropriate weight-average molecular weight thereof is in a range of about 100 to 30000. For the blending amount of the radiation curable monomer component or oligomer component, an amount allowing the adhesive strength of the pressure-sensitive adhesive layer to be reduced can be appropriately determined according to the type of the pressure-sensitive adhesive layer. Generally, the blending amount is, for example, 5 to 500 parts by weight, preferably about 40 to 150 parts by weight, based on 100 parts by weight of a base polymer such as an acryl-based polymer forming the pressure-sensitive adhesive.

Examples of the radiation curing-type pressure-sensitive adhesive include, besides the addition-type radiation curing-type pressure-sensitive adhesive described previously, an intrinsic radiation curing-type pressure-sensitive adhesive using, as a base polymer, a polymer having a carbon-carbon double bond in the polymer side chain or main chain or at the end of the main chain. The intrinsic radiation curing-type pressure-sensitive adhesive is preferable because it is not required to contain, or mostly does not contain an oligomer component or the like which is a low-molecular component, and therefore the oligomer component or the like does not migrate in the pressure-sensitive adhesive over time, so that a pressure-sensitive adhesive layer having a stable layer structure can be formed.

For the base polymer having a carbon-carbon double bond, one having a carbon-carbon double bond and also an adherability can be used without any particular limitation. Such a base polymer is preferably one having an acryl-based polymer as a basic backbone. Examples of the basic backbone of the acryl-based polymer include the acryl-based polymers described previously as an example.

The method for introducing a carbon-carbon double bond into the acryl-based polymer is not particularly limited, and various methods can be employed, but it is easy in molecular design to introduce the carbon-carbon double bond into a polymer side chain. Mention is made to, for example, a method in which a monomer having a functional group is copolymerized into an acryl-based polymer beforehand, and thereafter a compound having a functional group that can react with the above-mentioned functional group, and a carbon-carbon double bond is subjected to a condensation or addition reaction while maintaining the radiation curability of the carbon-carbon double bond.

Examples of the combination of these functional groups include a combination of a carboxylic acid group and an epoxy group, a combination of a carboxylic acid group and an aziridyl group, and a combination of a hydroxyl group and an isocyanate group. Among these combinations of functional groups, the combination of a hydroxyl group and an isocyanate group is suitable in terms of ease of reaction tracing. The functional group may be present at the side of any of the acryl-based polymer and the aforementioned compound as long as the combination of the functional groups is such a combination that the acryl-based polymer having a carbon-carbon double bond is generated, but for the preferable combination, it is preferred that the acryl-based polymer have a hydroxyl group and the aforementioned compound have an isocyanate group. In this case, examples of the isocyanate compound having a carbon-carbon double bond include metacryloyl isocyanate, 2-metacryloyloxy-ethyl isocyanate, m-isopropenyl-α,α-dimethylbenzyl isocyanate. As the acryl-based polymer, one obtained by copolymerizing the hydroxy group-containing monomers described previously as an example, ether-based compounds such as 2-hydroxyethy lvinyl ether, 4-hydroxybutyl vinyl ether and diethylene glycol monovinyl ether, and so on is used.

For the intrinsic radiation curing-type pressure-sensitive adhesive, the base polymer (particularly acryl-based polymer) having a carbon-carbon double bond can be used alone, but the radiation curable monomer component or oligomer component within the bounds of not deteriorating properties can also be blended. The amount of the radiation curable oligomer component or the like is normally within a range of 30 parts by weight or less, preferably in a range of 0 to 10 parts by weight, based on 100 parts by weight of the base polymer.

A photopolymerization initiator is preferably included in the radiation curing-type pressure-sensitive adhesive when it is cured by ultraviolet rays or the like. Examples of the photopolymerization initiator include α-ketol-based compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone-based compounds such as methoxyacetophenone, 2,2-dimethoxy-2-phenylacetophenone, 2,2-diethoxyacetophenone, and 2-methyl-1-[4-(methylthio)-phenyl]-2-morphorinopropane-1; benzoin ether-based compounds such as benzoin ethyl ether, benzoin isopropyl ether, and anisoin methyl ether; ketal-based compounds such as benzyldimethylketal; aromatic sulfonyl chloride-based compounds such as 2-naphthalenesulfonyl chloride; photoactive oxime-based compounds such as 1-phenyl-1,2-propanedione-2-(O-ethoxycarbonyl)oxime; benzophenone-based compounds such as benzophenone, benzoyl benzoic acid, and 3,3'-dimethyl-4-methoxybenzophenone; thioxanthone-based compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketone; acylphosphinoxide; and acylphosphonate. The blending amount of the photopolymerization initiator is, for example, about 0.05 to 20 parts by weight based on 100 parts by weight of the base polymer such as an acryl-based polymer which forms a pressure-sensitive adhesive.

When curing hindrance by oxygen occurs at the time of the irradiation of radiations, it is desirable to block oxygen (air) from the surface of the radiation curing-type pressure-sensitive adhesive layer 1b by some method. Examples include a method in which the surface of the pressure-sensitive adhesive layer 1b is covered with a separator, and a method in which irradiation of radiations such as ultraviolet rays or the like is carried out in a nitrogen gas atmosphere.

The pressure-sensitive adhesive layer 1b may contain various kinds of additives (e.g. colorant, thickener, bulking agent, filler, tackifier, plasticizer, antiaging agent, antioxidant, surfactant, cross-linker, etc.).

The thickness of the pressure-sensitive adhesive layer 1b is not particularly limited, but is preferably about 1 to 100 μm from the viewpoint of adjustment of the breaking strength, compatibility of fixation and retention of the thermosetting resin layer 2, and so on. The thickness of the pressure-sensitive adhesive layer 1b is preferably 2 to 80 μm, further preferably 5 to 60 μm.

(Thermosetting Resin Layer)

The thermosetting resin layer 2 in this embodiment can be suitably used as a reinforcing film that reinforces a base part on the primary mounted substrate side of the bump electrode of the primary mounted semiconductor device which is secondarily mounted on the surface.

The material that forms the thermosetting resin layer is, for example, a combination of a thermoplastic resin and a thermosetting resin. Alternatively, a thermoplastic resin or a thermosetting resin alone can be used.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylate copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET and PBT, a polyamideimide resin, and a fluororesin. These thermoplastic resins can be used alone, or in a combination of two or more thereof. Among these thermoplastic resins, an acrylic resin, which has less ionic impurities, has a high heat resistance and can ensure the reliability of a secondary mounted semiconductor device, is especially preferable.

The acrylic resin is not particularly limited, and examples thereof include polymers having as a component one or more of esters of acrylic acids or methacrylic acids which have a linear or branched alkyl group having 30 or less of carbon atoms, especially 4 to 18 carbon atoms. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and an eicosyl group.

Other monomers for forming the polymer are not particularly limited, and examples thereof include carboxyl group-containing monomers such as acrylic acid, methacrylic acid, carboxyethyl acrylate, carboxypentylacrylate, itaconic acid, maleic acid, fumaric acid, and crotonic acid; acid anhydride monomers such as maleic anhydride and itaconic anhydride; hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)-methyl acrylate; sulfonic acid group-containing monomers such as styrenesulfonic acid, allylsulfonic acid, 2-(meth)acrylamide-2-methylpropanesulfonic acid, (meth)acrylamidepropanesulfonic acid, sulfopropyl(meth)acrylate, and (meth)acryloyloxynaphthalenesulfonic acid; phosphoric acid group-containing monomers such as 2-hydroxyethylacryloyl phosphate; and cyano group-containing momomers such as acrylonitrile.

Examples of the thermosetting resin include a phenol resin, an amino resin, an unsaturated polyester resin, an epoxy resin, a polyurethane resin, a silicone resin, and a thermosetting polyimide resin. These resins can be used alone, or in a combination of two or more thereof. Particularly, an epoxy resin containing less ionic impurities that corrode a bump electrode is preferable. A curing agent for the epoxy resin is preferably a phenol resin.

The epoxy resin is not particularly limited as long as it is generally used as an adhesive composition, and for example a difunctional epoxy resin or a polyfunctional epoxy resin such as a bisphenol A type, a bisphenol F type, a bisphenol S type, a brominated bisphenol A type, a hydrogenated bisphenol A type, a bisphenol AF type, a biphenyl type, a naphthalene type, a fluorene type, a phenol novolak type, an orthocresol novolak type, a trishydroxyphenyl methane type or a tetraphenylol ethane type, or an epoxy resin such as a hydantoin type, a trisglycidyl isocyanurate type, or a glycidyl amine type is used. They can be used alone, or in a combination of two or more thereof. Among these epoxy resins, a novolak type epoxy resin, a biphenyl type epoxy resin, a trishydroxyphenyl methane type resin, or a tetraphenylol ethane type epoxy resin is especially preferable. This is because the aforementioned resins have a high reactivity with a phenol resin as a curing agent, and are excellent in heat resistance and so on.

Further, the phenol resin acts as a curing agent for the epoxy resin, and examples thereof include novolak type phenol resins such as a phenol novolak resin, a phenol aralkyl resin, a cresol novolak resin, a tert-butylphenol novolak resin, and a nonylphenol novolak resin, resole type phenol resins, and polyoxystyrenes such as polyparaoxystyrene. They can be used alone, or in a combination of two or more thereof. Among these phenol resins, a phenol novolak resin and a phenol aralkyl resin are especially preferable. This is because the connection reliability of a secondary mounted semiconductor device can be improved.

For example, the epoxy resin and the phenol resin are preferably blended at such a blending ratio that the equivalent of the hydroxyl group in the phenol resin per one equivalent of the epoxy group in the epoxy resin component is 0.5 to 2.0 equivalents. More preferable is 0.8 to 1.2 equivalents. That is, if the blending ratio of the resins falls out of the aforementioned range, the curing reaction does not proceed sufficiently, so that properties of the epoxy resin cured products are easily deteriorated.

In the present invention, a thermoplastic resin layer using an epoxy resin, a phenol resin, and an acrylic resin is especially preferable. These resins have less ionic impurities and have a high heat resistance, and therefore can ensure the reliability of a secondary mounted semiconductor device. The blending ratio in this case is such that the mixed amount of the epoxy resin and the phenol resin is 10 to 1000 parts by weight based on 100 parts by weight of the acrylic resin component.

A heat curing accelerating catalyst for the epoxy resin and the phenol resin is not particularly limited, and can be appropriately selected from known heat curing accelerating catalysts and used. The heat curing accelerating catalyst can be used alone, or in a combination of two or more kinds. As the heat curing accelerating catalyst, for example, an amine-based curing accelerator, a phosphorus-based curing accelerator, an imidazole-based curing accelerator, a boron-based curing accelerator, or a phosphorus-boron-based curing accelerator can be used.

A flux may be added to the thermoplastic resin layer 2 for removing an oxide film on the surface of a solder ball to facilitate mounting of a semiconductor element. The flux is not particularly limited, a previously known compound having a flux action can be used, and examples thereof include diphenolic acid, adipic acid, acetylsalicylic acid, benzoic acid, benzilic acid, azelaic acid, benzylbenzoic acid, malonic acid, 2,2-bis(hydroxymethyl)propionic acid, salicylic acid, o-methoxybenzoic acid, m-hydroxybenzoic acid, succinic acid, 2,6-dimethoxymethyl paracresol, hydrazide benzoate, carbohydrazide, dihydrazide malonate, dihydrazide succinate, dihydrazide glutarate, hydrazide salicylate, dihydrazide iminodiacetate, dihydrazide itaconate, trihydrazide citrate, thiocarbohydrazide, benzophenone hydrazone, 4,4'-oxybisbenzenesulfonyl hydrazide, and dihydrazide adipate. The added amount of the flux may be such an amount that the flux action is exhibited, and is normally about 0.1 to 20 parts by weight based on 100 parts by weight of the resin component contained in the thermoplastic resin layer.

When the thermoplastic resin layer 2 of this embodiment is preliminarily cross-linked to a degree, a polyfunctional compound that reacts with a functional group or the like at the end of the molecular chain of a polymer should be added as a cross-linker at the time of preparation. Consequently, adhesion properties under a high temperature can be improved to improve the heat resistance.

As the cross-linker, particularly polyisocyanate compounds such as tolylene diisocyanate, diphenylmethane diisocyanate, p-phenylene diisocyanate, 1,5-naphthalene diisocyanate, and an adduct of a polyhydric alcohol and a diisocyanate are more preferable. Preferably, the added amount of the cross-linker is normally 0.05 to 7 parts by weight based on 100 parts by weight of the polymer. If the amount of cross-linker is more than 7 parts by weight, the adhering strength is reduced, and thus is not preferable. On the other hand, if the amount of the cross-linker is less than 0.05 parts by weight, the cohesive strength becomes poor, and thus is not preferable. Other polyfunctional compounds such as an epoxy resin may be included as necessary together with the above-mentioned polyisocyanate compound.

An inorganic filler can be appropriately blended with the thermoplastic resin layer 2. Blending of the inorganic filler allows impartment of electrical conductivity, improvement of thermal conductivity, adjustment of a storage elastic modulus, and so on.

Examples of the inorganic filler include various inorganic powders made of ceramics such as silica, clay, plaster, calcium carbonate, barium sulfate, aluminum oxide, beryllium oxide, silicon carbide, and silicon nitride; metals such as aluminum, copper, silver, gold, nickel, chromium, lead, tin, zinc, palladium, and solder, or alloys; and carbon. They can be used alone, or in a combination of two or more thereof. Above all, silica, particularly fused silica is suitably used.

The average particle size of the inorganic filler is not particularly limited, but is preferably in a range of 0.005 to 10 µm, more preferably in a range of 0.01 to 5 µm, further preferably 0.1 to 2.0 µm. When the average particle size of the inorganic filler is less than 0.005 µm, particles are easily aggregated, so that it may be difficult to form the thermosetting resin layer. On the other hand, when the average particle size is more than 10 µm, inorganic particles are easily caught between the thermosetting resin layer and the primary mounted substrate, so that the reinforcement level may be reduced to deteriorate impact resistance and connection reliability of the secondary mounted semiconductor device. In the present invention, inorganic fillers having mutually different average particle sizes may be used in combination. The average particle size is a value determined using an optical particle size distribution analyzer (manufactured by HORIBA, Ltd.; model: LA-910).

The blending amount of the inorganic filler is preferably 10 to 400 parts by weight, more preferably 50 to 250 parts by weight based on 100 parts by weight of the organic resin component. When the blending amount of the inorganic filler is less than 10 parts by weight, the storage elastic modulus decreases, so that the stress relaxation reliability of the base region of the bump electrode may be considerably impaired. On the other hand, when the blending amount of the inorganic filler is more than 400 parts by weight, fluidity of the thermosetting resin layer 2 is reduced, so that the irregularities of the primary mounted substrate and the space of the base of the bump electrode are not sufficiently filled, and thus voids and cracks may be generated.

Besides the inorganic filler, other additives can be blended with the thermosetting resin layer 2 as necessary. Examples of other additives include a flame retardant, a silane coupling agent, and an ion trapping agent. Examples of the flame retardant include antimony trioxide, antimony pentaoxide, and a brominated epoxy resin. They can be used alone, or in a combination of two or more thereof. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone, or in a combination of two or more thereof. Examples of the ion trapping agent include a hydrotalcite and bismuth hydroxide. They can be used alone, or in a combination of two or more thereof.

In this embodiment, the melt viscosity of the thermosetting resin layer 2 at 60 to 100° C. before heat curing is preferably 4000 Pa·s or less, more preferably not less than 500 Pa·s and not more than 4000 Pa·s. When the melt viscosity at a temperature of 60 to 100° C., which is equivalent to the thermocompression bonding temperature, is in the above-mentioned range, entry of the bump electrode 4 (see FIG. 2A) into the thermosetting resin layer 2 can be facilitated.

The thickness of the thermosetting resin layer 2 (the total thickness in case of multiple layers) is not particularly limited, and may be approximately not less than 5 µm and not more than 50 µm in view of the strength of the thermosetting resin layer 2 and reinforcement of the base part of the bump electrode 4. The thickness of the thermosetting resin layer 2 may be appropriately determined with consideration given to the range of the base part which should be reinforced in the bump electrode 4.

Preferably, the thermosetting resin layer 2 of the reinforcing sheet 8 is protected by a separator (not illustrated). The separator has a function as a protective material that protects the thermosetting resin layer 2 until the reinforcing sheet is put to practical use. The separator is peeled off at the time of attaching the primary mounted semiconductor device 10 on the thermosetting resin layer 2 of the reinforcing sheet 8. As the separator, a film of polyethylene terephthalate (PET), polyethylene or polypropylene, a plastic film or paper surface-coated with a release agent such as a fluorine-based release agent or a long chain alkyl acrylate-based release agent, or the like can be used.

(Method for Producing a Reinforcing Sheet)

The reinforcing sheet 8 according to this embodiment can be prepared by, for example, preparing the back surface grinding tape 1 and the thermosetting resin layer 2 separately in advance, and finally bonding the former and the latter together. Specifically, the reinforcing sheet 8 can be prepared in accordance with the following procedure.

First, the base material layer 1a can be film formed by a previously known film formation method. Examples of the method for a film formation may include a calendar film formation method, a casting method in an organic solvent, an inflation extrusion method in a closed system, a T-die extrusion method, a co-extrusion method, and a dry lamination method.

Next, a pressure-sensitive adhesive composition for formation of a pressure-sensitive adhesive layer is prepared. Resins and additives such as those described in the section relating to the pressure-sensitive adhesive layer, and so on are blended in the pressure-sensitive adhesive composition.

The prepared pressure-sensitive adhesive composition is applied onto the base material layer 1a to form a coating film, and the coating film is then dried (cross-linked by heating as necessary) under predetermined conditions to form the pressure-sensitive adhesive layer 1b. The coating method is not particularly limited, and examples thereof include roll coating, screen coating, and gravure coating. For drying conditions, for example, the drying temperature is in a range of 80 to 150° C., and the drying time is in a range of 0.5 to 5 minutes. The pressure-sensitive adhesive layer 1b may be formed by applying a pressure-sensitive adhesive composition onto a separator to form a coating film, followed by drying the coating film under the aforementioned conditions. Thereafter, the pressure-sensitive adhesive layer 1b is bonded onto the base material layer 1a together with the separator. In this way, the back surface grinding tape 1 including the base material layer 1a and the pressure-sensitive adhesive layer 1b is prepared.

For example, the thermosetting resin layer 2 is prepared in the following manner. First, an adhesive composition which is a material for forming the thermosetting resin layer 2 is prepared. A thermoplastic component, an epoxy resin, various kinds of additives, and so on are blended in the adhesive composition as described in the section relating to the thermosetting resin layer.

Next, the prepared adhesive composition is applied onto a base material separator in a predetermined thickness to form a coating film, followed by drying the coating film under predetermined conditions to form a thermosetting resin layer. The coating method is not particularly limited, and examples thereof include roll coating, screen coating, and gravure coating. For drying conditions, for example, the drying temperature is in a range of 70 to 160° C., and the drying time is in a range of 1 to 5 minutes. The thermosetting resin layer may be formed by applying a pressure-sensitive adhesive composition onto a separator to form a coating film, followed by drying the coating film under the aforementioned conditions. Thereafter, the thermosetting resin layer is bonded onto the base material separator together with the separator.

Subsequently, the separator is peeled off from each of the back surface grinding tape 1 and the thermosetting resin layer 2, and the tape and the thermosetting resin layer are bonded together such that the thermosetting resin layer and the pressure-sensitive adhesive layer form a bonding surface. Bonding can be performed by, for example, heat pressure-bonding. At this time, the lamination temperature is not particularly limited and is, for example, preferably 30 to 100° C., more preferably 40 to 80° C. The linear pressure is not particularly limited and is, for example, preferably 0.98 to 196 N/cm, more preferably 9.8 to 98 N/cm. Next, the base material separator on the thermosetting resin layer is peeled off to obtain a reinforcing sheet according to this embodiment.

(Primary Mounted Semiconductor Device)

Figure 2A:
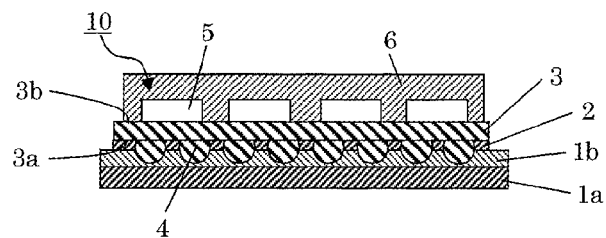
FIG. 2A is a sectional schematic view showing one step of a process for production of a semiconductor device according to one embodiment of the present invention.

As shown in FIG. 2A, the primary mounted semiconductor device 10 according to this embodiment may be a semiconductor device with the bump electrode 4 formed on a first main surface 3a. For example, the primary mounted semiconductor device 10 refers to a semiconductor device with a semiconductor chip or semiconductor element 5 connected to the bump electrode 4 (also referred to as a solder ball, a solder bump, a conductive ball or the like) through a so-called interposer or substrate 3, and is usually sealed with a sealing resin 6 to form a package. Therefore, strictly speaking, the primary mounted semiconductor device 10 shown in FIG. 2A is a sealing assembly in which a plurality of primary mounted semiconductor devices are sealed with a resin, but in this specification, the former and the latter may be referred to as a primary mounted semiconductor device without being discriminated from each other. Primary mounted semiconductor devices also include a multi-chip module (MCM), a chip-size package (CSP), a ball grid array (BGA), and so on.

Specifically, the primary mounted semiconductor device 10 of this embodiment is formed principally of the interposer 3 that can be cut out; a semiconductor chip 5 arranged in the form of an X-Y plane on the interposer 3 and sealed with the sealing resin 6; and the bump electrode 4 electrically connected to an electrode (not illustrated) formed on the semiconductor chip 5 with the interposer 3 held therebetween. Preferably, electrode junction is established between the semiconductor chip 5 and the interposer 3, and a plurality of semiconductor chips 5 are collectively sealed with the sealing resin 6.

The interposer 3 is not particularly limited, and examples thereof include ceramic substrates, plastic (epoxy, bismaleimide triazine, polyimide etc.) substrates, and silicon substrates.

The form of electrode junction between the semiconductor chip 5 and the interposer 3 is not particularly limited, and examples thereof include wire bonding through a gold wire or a copper wire, and bump junction. Examples of the material of the bump electrode include gold, copper, nickel, aluminum, solder, and combinations thereof. The size of the bump electrode is not particularly limited, and is, for example, about 100 to 300 μm in terms of the diameter.

Figure 2B:
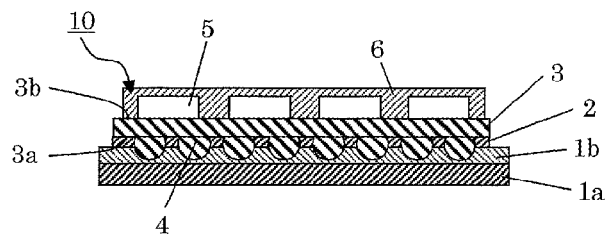
FIG. 2B is a sectional schematic view showing one step of the process for production of a semiconductor device according to one embodiment of the present invention.
Figure 2C:
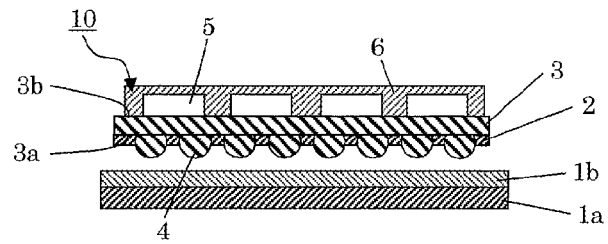
FIG. 2C is a sectional schematic view showing one step of the process for production of a semiconductor device according to one embodiment of the present invention.

In the reinforcing sheet 8, the thickness of the thermosetting resin layer 2 is preferably 50% or less, more preferably 48% or less, especially preferably 45% or less of the height of the bump electrode 4. Accordingly, the bump electrode 4 can extend over the thermosetting resin layer 2 to the pressure-sensitive adhesive layer 1b. As a result, the bump electrode 4 is exposed from the thermosetting resin layer 2 at the time of subsequently peeling off the backside grinding tape 1 (see FIG. 2C), and therefore a proper electrical connection with the wiring substrate can be obtained. At the same time, the amount of exposure of the bump electrode from the thermosetting resin layer is easily adjusted, and therefore the base part can be intensively reinforced efficiently.

(Bonding)

As shown in FIG. 2A, the reinforcing sheet 8 is bonded to the first main surface 3a of the primary mounted semiconductor device 10 on which the bump electrode 4 is formed. It is preferred that bonding is performed under heating and pressing conditions from the viewpoints of versatility and productivity, and a roll compression bonding, press compression bonding method, or the like is suitably used.

Preferably, the bonding temperature is not lower than the softening point of the resin that forms the thermosetting resin layer 2 and not higher than the curing reaction initiation temperature from the viewpoint of fluidity of the thermosetting resin layer 2. The bonding temperature is usually selected from a temperature range of about 60° C. to 100° C. Accordingly, fluidity of the resin can be secured to sufficiently fill a gap between bump electrodes with the thermosetting resin layer 2, and sufficient adhesion can be obtained.

Compression is performed by applying a pressure of preferably 0.1 to 1 MPa, more preferably 0.3 to 0.7 MPa to press the reinforcing sheet from the viewpoint of strength of the semiconductor device and fluidity of the thermosetting resin sheet. Compression bonding may be performed under a reduced pressure (1 to 1000 Pa) as necessary.

[Step (B)]

In the step (B), the primary mounted semiconductor device 10 is subjected to backside grinding processing under retention by the reinforcing sheet 8. In the grinding step, grinding is performed from a second main surface (i.e., back surface) 3b of the primary mounted semiconductor device 10 on a side opposite to the first main surface 3a (see FIG. 2B). In this embodiment, only the sealing resin 6 is ground, but the present invention is not limited thereto, and the back surface of the semiconductor chip 5 may be ground. When the back surface of the semiconductor chip 5 is not resin-sealed, the back surface of the semiconductor chip 5 is directly ground. The thinning processor to be used for backside grinding of the primary mounted semiconductor device 10 is not particularly limited, and for example, a grinder (back grinder), a polishing pad, or the like may be used. Backside grinding may be performed by a chemical method such as etching. Backside grinding is performed until the primary mounted semiconductor device has a desired thickness (e.g. 10 to 500 μm).

[Step (C)]

Figure 2D:
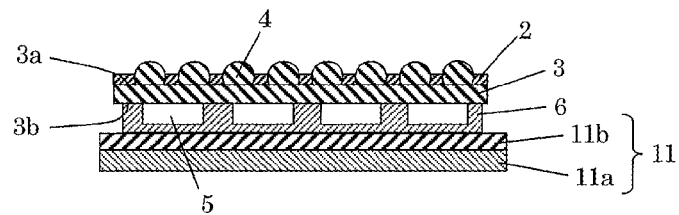
FIG. 2D is a sectional schematic view showing one step of the process for production of a semiconductor device according to one embodiment of the present invention.

After the grinding step, the primary mounted semiconductor device 10 with the thermosetting resin layer 2 bonded thereon is peeled off from the backside grinding tape 1 (FIG. 2C), and the primary mounted semiconductor device 10 with the thermosetting resin layer 2 and the dicing tape 11 are bonded to each other (see FIG. 2D). At this time, the primary mounted semiconductor device 10 and the dicing tape 11 are bonded to each other in such a manner that the second main surface 3b side of the primary mounted semiconductor device and the pressure-sensitive adhesive layer 11b of the dicing tape 11 face each other. Accordingly, the thermosetting resin layer 2 bonded to the first main surface 3a of the primary mounted semiconductor device 10 is exposed (upward in FIG. 2D). The dicing tape 11 has a structure in which the pressure-sensitive adhesive layer 11b is laminated on the base material layer 11a. The base material layer 11a and the pressure-sensitive adhesive layer 11b can be suitably prepared using the components and production methods shown in the section of the base material layer 1a and the pressure-sensitive adhesive layer 1b of the backside grinding tape 1. A commercially available dicing tape can also be suitably used.

At the time of peeling off the primary mounted semiconductor device 10 from the backside grinding tape 1, the primary mounted semiconductor device 10 can be easily peeled off by irradiating the pressure-sensitive adhesive layer 2b with radiation to cure the pressure-sensitive adhesive layer 1b when the pressure-sensitive adhesive layer 1b is radiation-curable. The irradiation amount of the radiation may be appropriately determined with consideration given to the type of radiation to be used, the cure degree of the pressure-sensitive adhesive layer, and so on. When the pressure-sensitive adhesive layer 1b is not radiation-curable, the backside grinding tape 1 may be peeled off after the primary mounted semiconductor device 10 with the thermosetting resin layer 2 and the dicing tape 11 are bonded to each other after backside grinding.

In the reinforcing sheet 8 according to this embodiment, the peel strength between the thermosetting resin layer 2 and the pressure-sensitive adhesive layer 1b is preferably not less than 0.02 N/20 mm and not more than 0.3 N/20 mm, more preferably not less than 0.03 N/20 mm and not more than 0.2 N/20 mm. When the peel strength is in the above-mentioned range, both the retention strength of the primary mounted semiconductor device at the time of backside grinding and the peeling property at the time of peeling off the primary mounted semiconductor device from the backside grinding tape can be secured with good balance.

[Dicing Step]

Figure 2E:
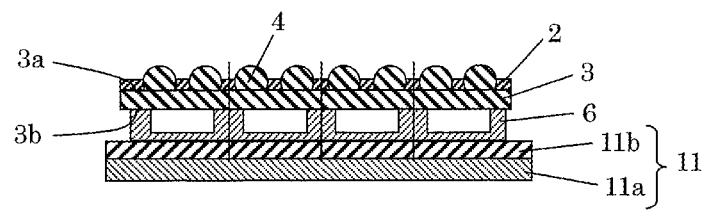
FIG. 2E is a sectional schematic view showing one step of the process for production of a semiconductor device according to one embodiment of the present invention.

In the dicing step, the primary mounted semiconductor device 10 and the thermosetting resin layer 2 are diced to form individual pieces of the primary mounted semiconductor device 10 with the thermosetting resin layer 2 as shown in FIG. 2E. The primary mounted semiconductor device 10 obtained here is integrated with the thermosetting resin layer 2 cut in the same shape. Dicing is performed in accordance with a usual method from the first main surface 3a side of the primary mounted semiconductor device 10 on which the thermosetting resin layer 2 is bonded.

In this step, for example, a cutting method called full cutting in which a cut is made to the dicing tape 11 can be employed. The dicing device to be used in this step is not particularly limited, and a previously known one can be used.

When expansion of the dicing tape is performed subsequently to the dicing step, the expansion can be performed using a previously known expanding device. The expanding device includes a doughnut-shaped outer ring capable of pressing the dicing tape downward through a dicing ring, and an inner ring having a diameter smaller than that of the outer ring and supporting the dicing tape. Owing to the expanding step, neighboring components can be prevented from coming into contact with each other to cause damage at the time of picking up the primary mounted semiconductor device 10 with the thermosetting resin layer 2.

Next, pickup is performed for collecting the fragmented primary mounted semiconductor device 10 prior to the step (D) that is a secondary mounting process. The pickup method is not particularly limited, and previously known various methods can be employed. Examples include a method in which individual pieces of the primary mounted semiconductor devices 10 are pushed up by a needle from the base material layer side of the dicing tape, and the pushed-up primary mounted semiconductor device 10 is picked up by a pickup device. The picked-up primary mounted semiconductor device 10 is integrated with the thermosetting resin layer 2 bonded to the first main surface 3a, so that a laminate is formed.

Here, pickup is performed after irradiating the pressure-sensitive adhesive layer 11b with ultraviolet rays when the pressure-sensitive adhesive layer 11b is of an ultraviolet-ray curing-type. Consequently, adhesive power of the pressure-sensitive adhesive layer 11b to the primary mounted semiconductor device 10 decreases, so that it becomes easy to peel off the primary mounted semiconductor device 10. As a result, pickup can be performed without damaging the primary mounted semiconductor device 10. Conditions such as an irradiation intensity and an irradiation time for irradiation of ultraviolet rays are not particularly limited, and may be appropriately set as necessary. As a light source used for irradiation of ultraviolet rays, for example, a low-pressure mercury lamp, a low-pressure high-power lamp, a medium-pressure mercury lamp, an electrodeless mercury lamp, a xenon flash lamp, an excimer lamp, an ultraviolet LED, or the like can be used.

[Step (D)]

Figure 2F:
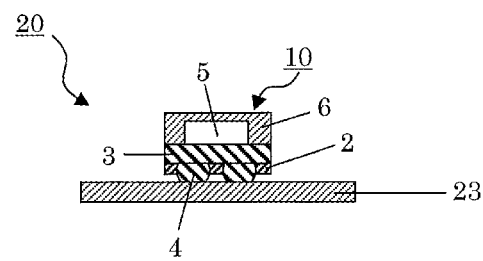
FIG. 2F is a sectional schematic view showing one step of the process for production of a semiconductor device according to one embodiment of the present invention.

In the step (D), the primary mounted semiconductor device 10 with the thermosetting resin layer 2 is electrically connected to the wiring substrate 23 through the bump electrode 4 (see FIG. 2F). Specifically, the primary mounted semiconductor device 10 is fixed to the wiring substrate 23 by a usual method such that the first main surface 3a of the primary mounted semiconductor device 10 faces the wiring substrate 23. For example, by melting a joining conductive material (not illustrated) attached on a connection pad of the wiring substrate 23 while pressing the bump electrode 4 formed on the primary mounted semiconductor device 10 with the bump electrode 4 being in contact with the conductive material, electrical connection between the primary mounted semiconductor device 10 and the wiring substrate 23 can be secured. Since the thermosetting resin layer 2 is bonded on the first main surface 3a side of the primary mounted semiconductor device 10, an electrical connection between the bump electrode 4 and the wiring substrate 23 can be obtained while the base part of the bump electrode 4 is reinforced.

In the secondary mounting process, the temperature is 200 to 300° C. as a general heating condition, and the pressure is 0 to 1000 N as a pressing condition. The thermocompression bonding treatment in the secondary mounting process may be performed in multiple stages. For example, a procedure can be employed in which the treatment is performed at 150° C. and 50 N for 10 seconds, followed by performing the treatment at 280° C. and 10 to 100 N for 10 seconds. By performing the thermocompression bonding treatment in multiple stages, the resin between the bump electrode 4 and the pad can be efficiently removed to achieve a more satisfactory junction between metals.

Examples of the wiring substrate 23 include known wiring substrates such as rigid wiring substrates, flexible wiring substrates, ceramic wiring substrates, metal core wiring substrates, and organic substrates.

In the secondary mounting process, one or both of the bump electrode 4 and the conductive material are melted to be connected to each other, and the temperature at the time of melting the bump electrode 4 and the conductive material is normally about 260° C. (e.g. 250° C. to 300° C.). The reinforcing sheet according to this embodiment can possess such a heat resistance that endures a high temperature in the secondary mounting process by forming the thermosetting resin layer 2 with an epoxy resin or the like.

The thermosetting resin layer 2 may be cured by applying heat during secondary mounting, or may be cured by providing a curing step after the secondary mounting process. The heating temperature in the curing step is not particularly limited as long as the thermosetting resin layer 2 is cured, and the heating temperature may be about 100 to 300° C.

[Secondary Mounted Semiconductor Device]

A secondary mounted semiconductor device obtained using the reinforcing sheet will now be described with reference to the drawings (see FIG. 2F). In a semiconductor device 20 according to this embodiment, the primary mounted semiconductor device 10 and the wiring substrate 23 are electrically connected to each other through the bump electrode 4 formed on the primary mounted semiconductor device 10 and a conductive material (not illustrated) provided on the wiring substrate 23. The thermosetting resin layer 2 is disposed at the base part of the bump electrode 4 so as to reinforce the base part, and thus excellent impact resistance can be exhibited.

Second Embodiment

A primary mounted semiconductor device to be used in this embodiment has a desired thickness, and therefore a grinding step is omitted. Accordingly, as a reinforcing sheet in the second embodiment, a reinforcing sheet including a dicing tape, and a thermosetting resin layer laminated on the dicing tape is used.

[Step (A)]

Figure 3A:
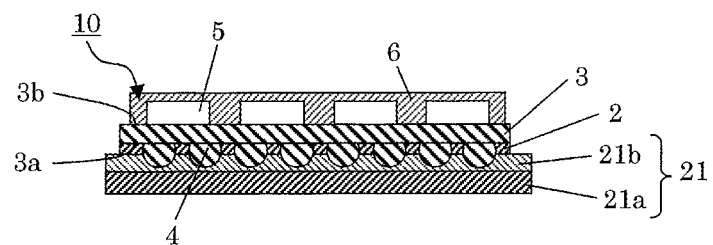
FIG. 3A is a sectional schematic view showing one step of a process for production of a semiconductor device according to another embodiment of the present invention.
Figure 3B:
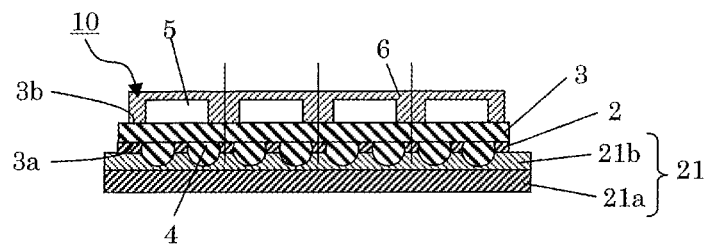
FIG. 3B is a sectional schematic view showing one step of the process for production of a semiconductor device according to another embodiment of the present invention.

In the step (A), a predetermined reinforcing sheet is bonded to a first main surface 3a of a primary mounted semiconductor device 10. The reinforcing sheet includes a dicing tape 21, and a thermosetting resin layer 2 laminated on the dicing tape 21 (see FIG. 3A). The dicing tape 21 includes a base material layer 21a, and a pressure-sensitive adhesive layer 21b laminated on the base material layer 21a. The thermosetting resin layer 2 is laminated on the pressure-sensitive adhesive layer 21b. As the base material layer 21a and pressure-sensitive adhesive layer 21b of the dicing tape 21, and the thermosetting resin layer 2, the same base material layer 1a and pressure-sensitive adhesive layer 1b, and the same thermosetting resin layer 2 as in the first embodiment can be used. As the primary mounted semiconductor device and bonding conditions and so on, the same primary mounted semiconductor device and bonding conditions and so on as in the first embodiment can be employed.

[Step (B)]

In the step (B), the primary mounted semiconductor device is subjected to dicing processing under retention by the reinforcing sheet. As dicing conditions, etc., the same dicing conditions etc. as in the first embodiment can be suitably employed.

Then, a secondary mounted semiconductor device can be produced by carrying out the step (D) after picking up the individual pieces of primary mounted semiconductor device 10 as in the case of the first embodiment.

Third Embodiment

In the first embodiment, an aspect in which the reinforcing sheet includes a base material layer, a pressure-sensitive adhesive layer, and a thermosetting resin layer has been described as a configuration of the reinforcing sheet, but in the third embodiment, a reinforcing sheet further including an intermediate layer formed of a thermoplastic resin between a base material layer and a pressure-sensitive adhesive layer will be described. A predetermined semiconductor device can be produced by performing the same steps as in the first embodiment except that the reinforcing sheet includes an intermediate layer.

Figure 4:
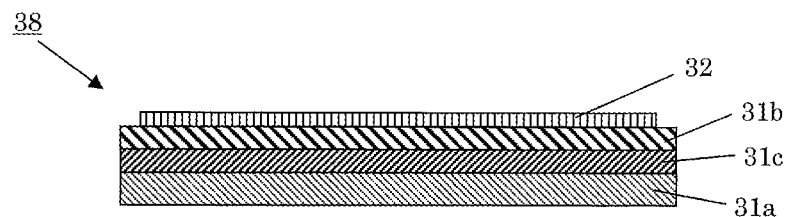
FIG. 4 is a sectional schematic view showing a reinforcing sheet according to another embodiment of the present invention.

As shown in FIG. 4, a reinforcing sheet 38 includes a base material layer 31a, an intermediate layer 31c, a pressure-sensitive adhesive layer 31b, and a thermosetting resin layer 2 in this order. When the size of the bump electrode increases, it is necessary to increase the thickness of each of the thermosetting resin layer and the pressure-sensitive adhesive layer for entry of the bump electrode at the time of bonding the reinforcing sheet. However, when the thickness of each of the layers is increased, it is difficult to intensively reinforce the base region of the bump electrode, and the breaking strength of the pressure-sensitive adhesive layer decreases. On the other hand, when the intermediate layer 31c formed of a thermoplastic resin is provided as in this embodiment, a bump electrode 4 can be easily made to enter into the intermediate layer 31c softened by heating at the time of bonding, and therefore the necessity to change the thickness of each of the thermosetting resin layer 2 and the pressure-sensitive adhesive layer 31b can be eliminated.

As a material for forming the intermediate layer 31c, a thermoplastic resin that is softened at a bonding temperature in the step (A) is suitable. Examples of the thermoplastic resin include acrylic resins, polyesters, polyolefins, polyimides, polyamide-imides, polysiloxanes, polyethers, polystyrenes, polysulfides, and polycarbonate. Among them, acrylic resins are preferred from the viewpoint of heat resistance, moisture-absorption characteristics, and a glass transition temperature.

Fourth Embodiment

In the first embodiment, a package with a semiconductor chip flip-chip-mounted on an interposer is used as a primary mounted semiconductor device, but in the fourth embodiment, a wafer level chip size package (WS-CSP) (hereinafter, also referred to as a "CSP") is used.

Figure 5:
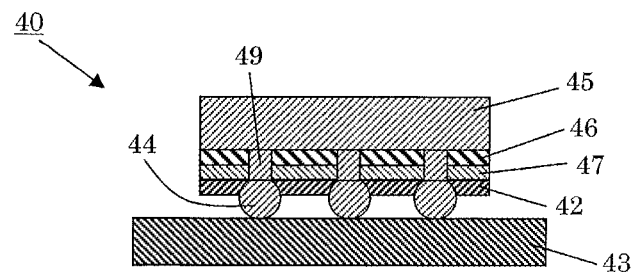
FIG. 5 is a sectional schematic view showing a secondary mounted semiconductor device according to another embodiment of the present invention.

FIG. 5 shows a secondary mounted semiconductor device 40 with a CSP secondarily mounted on a wiring substrate 43. The CSP includes a chip 45, a conductive pillar 49, and a rewiring layer 46 each formed on one surface of the chip 45, a sealing resin layer 47 laminated on the rewiring layer 46, and a bump electrode 44 provided at the tip of the conductive pillar 49, and a thermosetting resin layer 42 for reinforcing the base part of the bump electrode is further laminated on the sealing resin layer 47 of the CSP. The secondary mounted semiconductor device 40 can be suitably produced by performing the steps as described in the first embodiment except that the CSP is used as a primary mounted semiconductor device.

EXAMPLES

Hereinafter, preferred examples of the present invention will be described in detail in an illustrative manner. It is to be noted that the materials, blending amounts, and so on described in examples are not intended to limit the scope of the present invention unless they are particularly specified. The term "part(s)" means part(s) by weight.

Example 1

Preparation of Thermosetting Resin Layer

To 100 parts of an acrylic acid ester-based polymer mainly composed of ethyl acrylate-methyl methacrylate (trade name "PARACRON W-197CM" manufactured by Negami Chemical Industrial Co., Ltd.), 23 parts of an epoxy resin 1 (trade name "EPIKOTE 1004" manufactured by JER Co., Ltd.), 209 parts of an epoxy resin 2 (trade name "EPIKOTE 828" manufactured by JER Co., Ltd.), 215 parts of a phenol resin (trade name "MILEX XLC-4L" manufactured by Mitsui Chemicals, Incorporated), 370 parts of spherical silica (trade name "YC100C-MLC" manufactured by Admatechs Company Limited), 5.4 parts of an organic acid (trade name "ORTHOANISIC ACID" manufactured by Tokyo Chemical Industry Co., Ltd), and 2.7 parts of an imidazole catalyst (trade name "2PHZ-PW" manufactured by SHIKOKU CHEMICALS CORPORATION) were dissolved in ethyl ethyl ketone to prepare a resin composition solution having a solid concentration of 23.6% by weight.

This resin composition solution was applied onto a release liner (separator), i.e., a release-treated film formed of a 50 μm-thick polyethylene terephthalate film subjected to a silicone-release treatment, and the applied solution was then dried at 130° C. for 2 minutes to prepare a 30 μm-thick thermosetting resin layer.

(Preparation of Pressure-Sensitive Adhesive Layer)

86.4 parts of acrylic acid-2-ethylhexyl (hereinafter, also referred to as "2EHA"), 13.6 parts of acrylic acid-2-hydroxyethyl (hereinafter, also referred to as "HEA"), 0.2 parts of benzoyl peroxide, and 65 parts of toluene were added in a reaction vessel provided with a cooling pipe, a nitrogen introduction pipe, a thermometer, and a stirrer, and the mixture was subjected to a polymerization treatment in a nitrogen stream at 61° C. for 6 hours to obtain an acryl-based polymer A.

To the acryl-based polymer A was added 14.6 parts of 2-methacryloyloxyethyl isocyanate (hereinafter, also referred to as "MOI"), and the mixture was subjected to an addition reaction treatment in an air stream at 50° C. for 48 hours to obtain an acryl-based polymer A'.

Next, to 100 parts of the acryl-based polymer A' were added 1 part of a polyisocyanate compound (trade name "CORONATE L" manufactured by Nippon Polyurethane Industry Co., Ltd.) and 5 parts of a photopolymerization initiator (trade name "IRGACURE 651" manufactured by Ciba Specialty Chemicals Inc.) to obtain a pressure-sensitive adhesive composition solution A.

The pressure-sensitive adhesive composition solution A was applied onto a silicone-treated surface of a release liner made of polyethylene terephthalate (PET), and was dried at 120° C. for 2 minutes by heating to form a 50 μm-thick pressure-sensitive adhesive layer. A PET base material that was not silicone-treated was then bonded onto the formed pressure-sensitive adhesive layer. The PET base material had a thickness of 50 μm.

(Preparation of Reinforcing Sheet)

The release liner on the pressure-sensitive adhesive layer was peeled off, and the obtained pressure-sensitive adhesive layer and the thermosetting resin layer were then bonded to each other at 40° C. by a hand roller to prepare a reinforcing sheet.

(Bonding to Wafer)

The release liner on the thermosetting resin layer was peeled off, and the thermosetting resin layer of the reinforcing sheet was then bonded to a bump-formed surface of a wafer using a bonding device (DR-3000II manufactured by NITTO SEIKI CO., Ltd.) to prepare a wafer with a reinforcing sheet.

<Bonding Conditions>
temperature: 80° C.
speed: 3 mm/s
pressure: 100% (0.5 MPa)
<Evaluation Wafer>
manufactured by WALTS CO., LTD.
FC150JY_LF
bump height: 70 μm Example 2

A reinforcing sheet and a wafer with a reinforcing sheet were prepared in the same manner as in Example 1 except that in preparation of a pressure-sensitive adhesive layer, the blending amount of the polyisocyanate compound was 0.5 parts based on 100 parts of the acryl-based polymer A'.

Example 3

A reinforcing sheet and a wafer with a reinforcing sheet were prepared in the same manner as in Example 1 except that in preparation of a pressure-sensitive adhesive layer, the blending amount of the polyisocyanate compound was 0.2 parts based on 100 parts of the acryl-based polymer A'.

Example 4

A reinforcing sheet and a wafer with a reinforcing sheet were prepared in the same manner as in Example 1 except that in preparation of a pressure-sensitive adhesive layer, the blending amount of the polyisocyanate compound was 0.1 parts based on 100 parts of the acryl-based polymer A'.

Comparative Example 1

A reinforcing sheet and a wafer with a reinforcing sheet were prepared in the same manner as in Example 1 except that in preparation of a pressure-sensitive adhesive layer, the blending amount of the polyisocyanate compound was 2 parts based on 100 parts of the acryl-based polymer A'.

Comparative Example 2

A reinforcing sheet and a wafer with a reinforcing sheet were prepared in the same manner as in Example 1 except that in preparation of a pressure-sensitive adhesive layer, the polyisocyanate compound was not blended.

[Evaluation]

(Measurement of Breaking Strength of Pressure-Sensitive Adhesive Layer)

The pressure-sensitive adhesive layer prepared in the above-described procedure was irradiated with UV light of 300 mJ/cm$^2$ to cure the pressure-sensitive adhesive layer, and the cured pressure-sensitive adhesive layer was cut to a size of 30 mm (width)×10 mm (length), and provided as a test piece. The test piece was set in a tension tester "AUTO-GRAPH ASG-50D Model" (manufactured by Shimadzu Corporation), a tension test was conducted at a tension rate of 300 mm/min, a chuck-to-chuck distance of 10 mm and room temperature (23° C.), and a stress-strain curve was obtained. A stress at the time when the test piece was broken in the test was determined, and defined as a breaking strength. The results are shown in Table 1.

(Measurement of Melt Viscosity of Pressure-Sensitive Adhesive Layer)

The melt viscosity of the pressure-sensitive adhesive layer (before curing) prepared in the above-described procedure was measured. The melt viscosity was a value measured by a parallel plate method using a rheometer (RS-1 manufactured by HAAKE Company). More specifically, the melt viscosity was measured over a range from 50° C. to 120° C. under the conditions of a gap of 100 μm, a rotation plate diameter of 20 mm, a rotation speed of 10 s$^-$, and a temperature rise rate of 10° C./minute. The results showed that in Examples 1 to 4 and Comparative Example 2, the melt viscosity was 4000 Pa·s or less over the whole of the above-mentioned temperature range. On the other hand, in Comparative Example 1, the melt viscosity exceeded 4000 Pa·s at some stage in the above-mentioned temperature range. Table 1 shows measurement results of the melt viscosity at 80° C. in the above-mentioned temperature range.

(Evaluation on Transference of Resin Component of Reinforcing Sheet to Bump)

From the PET base material side of the wafer with a reinforcing sheet, which was prepared in the above-described procedure, UV light of 300 mJ/cm$^2$ was applied to cure the pressure-sensitive adhesive layer, and thereafter, the pressure-sensitive adhesive layer was peeled off from the thermosetting resin layer along with the base material. The bump at this time was observed with an optical microscope (magnification: 500) to check whether or not some resin component of the reinforcing sheet was transferred to the bump (presence/absence of resin residues). The resin residues transferred to the bump were identified in the following procedure using a microscopic FT-IR. The resin residues on the bump observed with the optical microscope were spread on a diamond cell, and an infrared spectrum was measured at a resolution of 4.0 cm$^{-1}$ and a cumulative number of 512 times by a transmission method using a microscopic FT-IR (Thermo Fisher Scientific, "Nicolet 8700"). When a silica filler-derived peak was observed at 1100 cm$^{-1}$, the resin residues were identified to be derived from the thermosetting resin layer. Otherwise, the resin residues were identified to be derived from the pressure-sensitive adhesive layer. The results are shown in Table 1.

TABLE 1

| | | Example 1 | Example 2 | Example 3 | Example 4 | Comparative Example 1 | Comparative Example 2 |
|---|---|---|---|---|---|---|---|
| Pressure-sensitive adhesive layer | Acryl polymer A'[parts] | 100 | 100 | 100 | 100 | 100 | 100 |
| | Polyisocyanate [parts] | 1 | 0.5 | 0.2 | 0.1 | 2 | 0 |
| | Breaking strength [MPa] | 0.5 | 0.3 | 0.2 | 0.07 | 0.8 | 0.05 |
| | Melt viscosity at 80° C. [Pa · s] | 3900 | 3500 | 2000 | 1200 | 8000 | 500 |
| Evaluation | Resin residues on bump | Absent | Absent | Absent | Absent | Present | Present |
| | Identification of resin residues | — | — | — | — | Thermosetting resin layer | Pressure-sensitive adhesive layer |

Table 1 shows that in the Examples, neither the thermosetting resin layer nor the pressure-sensitive adhesive layer was transferred to the bump, and exposure of the bump from the thermosetting resin layer and peeling of the pressure-sensitive adhesive layer were smoothly conducted. On the other hand, in Comparative Example 1, the thermosetting resin layer was transferred to the bump. This may be because the breaking strength and the melt viscosity of the pressure-sensitive adhesive layer were excessively high, so that the pressure-sensitive adhesive layer was not able to follow the shape of the bump, and thus exposure of the bump from the thermosetting resin layer was hindered. In Comparative Example 2, the pressure-sensitive adhesive layer was transferred to the bump. This may be because the breaking strength of the pressure-sensitive adhesive layer was excessively low, so that the pressure-sensitive adhesive layer was not able to resist the stress when peeled off from the thermosetting resin layer.

REFERENCE CHARACTER LIST

1 Backside grinding tape
1a, 21a, 31a Base material layer
1b, 21b, 31b Pressure-sensitive adhesive layer
2 Thermosetting resin layer
3 Interposer
3a First main surface of interposer
3b Second main surface of interposer on a side opposite to first main surface 4, 44 Bump electrode
5, 45 Semiconductor chip (semiconductor element)
6, 46 Sealing resin
8, 38 Reinforcing sheet
11, 21 Dicing tape
10 Primary mounted semiconductor device
20, 40 Secondary mounted semiconductor device
31c Intermediate layer

The invention claimed is:

1. A reinforcing sheet for reinforcing a secondary mounted semiconductor device in which a primary mounted semiconductor device with a bump electrode formed on a first main surface is electrically connected to a wiring substrate through the bump electrode, wherein
the reinforcing sheet comprises a base material layer, a pressure-sensitive adhesive layer and a thermosetting resin layer in this order, and
the pressure-sensitive adhesive layer has a breaking strength of 0.07 MPa or more, and a melt viscosity of 4000 Pa·s or less at 60 to 100° C.

2. The reinforcing sheet according to claim 1, wherein the thickness of the thermosetting resin layer is 50% or less of a height of the bump electrode.

3. The reinforcing sheet according to claim 1, wherein a peel strength between the thermosetting resin layer and the pressure-sensitive adhesive layer is not less than 0.02 N/20 mm and not more than 0.3 N/20 mm.

4. The reinforcing sheet according to claim 1, further comprising an intermediate layer formed of a thermoplastic resin between the base material layer and the pressure-sensitive adhesive layer.

5. A method for producing a secondary mounted semiconductor device in which a primary mounted semiconductor device with a bump electrode formed on a first main surface is electrically connected to a wiring substrate through the bump electrode, the method comprising the steps of:
(A) bonding the reinforcing sheet according to claim 1 to the first main surface of the primary mounted semiconductor device;
(B) subjecting the primary mounted semiconductor device to processing under retention by the reinforcing sheet;
(C) peeling off the thermosetting resin layer and the pressure-sensitive adhesive layer in the reinforcing sheet to obtain a primary mounted semiconductor device with the thermosetting resin layer; and
(D) electrically connecting the primary mounted semiconductor device with the thermosetting resin layer to the wiring substrate through the bump electrode.

6. The method for producing a secondary mounted semiconductor device according to claim 5, wherein the reinforcing sheet is bonded in such a manner that the bump electrode extends to the pressure-sensitive adhesive layer in the step (A).

7. The method for producing a secondary mounted semiconductor device according to claim 5, wherein a radiation-curable pressure-sensitive adhesive layer is provided as the pressure-sensitive adhesive layer, and irradiated with a radiation, followed by carrying out the step (C).

* * * * *